United States Patent [19]
Ward

[11] Patent Number: 4,721,683
[45] Date of Patent: Jan. 26, 1988

[54] USE OF ALKYLPHOSPHINES AND ALKYLARSINES IN ION IMPLANTATION

[75] Inventor: Jack E. Ward, Long Beach, Calif.

[73] Assignee: American Cyanamid Company, Stamford, Conn.

[21] Appl. No.: 52,810

[22] Filed: May 21, 1987

[51] Int. Cl.$^4$ .......................................... H01L 21/265
[52] U.S. Cl. ........................................ 437/20; 357/91;
427/38; 437/18; 437/930
[58] Field of Search ........................... 437/18, 20, 930;
357/91; 427/38

[56] References Cited

U.S. PATENT DOCUMENTS

| | | | |
|---|---|---|---|
| 3,909,305 | 9/1975 | Boroffka et al. | 437/20 |
| 3,960,605 | 6/1976 | Beck et al. | 437/20 |
| 4,187,124 | 2/1980 | Muller et al. | 437/20 |
| 4,385,946 | 5/1983 | Finegan et al. | 437/20 |

FOREIGN PATENT DOCUMENTS 0165717  8/1985  Japan .......................... 148/DIG. 83

OTHER PUBLICATIONS

Knoell et al, Jour. Appl. Phys. 57 (1985), 1322.
Miyaguchi et al, Jap. Jour. Appl. Phys. 22 (1983), L-225.
Ion-Implantation, ed. J. F. Ziegler, Academic Press, 1984, N.Y., pp. 621-627.

*Primary Examiner*—Upendra Roy
*Attorney, Agent, or Firm*—Gordon L. Hart

[57] ABSTRACT

Liquid alkylphosphines and alkylarsines are used as the ion source for improved ion implantation in the doping of semiconductor materials. A higher proportion of the total beam current is obtained as phosphorus and arsenic ion beam current in comparison with the use of gaseous phosphine and arsine, respectively, as the ion sources. Tertiarybutylphosphine and isobutylphosphine are the most preferred alkylphosphines, and tertiarybutylarsine is the most preferred alkylarsine for this use.

7 Claims, No Drawings

USE OF ALKYLPHOSPHINES AND ALKYLARSINES IN ION IMPLANTATION

FIELD OF INVENTION

The invention relates to the use of certain alkylphosphines and alkylarsines as phosphorus ion and arsenic ion sources, respectively, for the ion implantation doping of semiconductor materials.

BACKGROUND OF PRIOR ART

Ion implantation provides a technique for the introduction of controlled amounts of dopants into semiconductor materials in order to modify their electronic properties. A review of ion implantation technology and description of the equipment and processes involved may be found in "Crystalline Semiconducting Materials and Devices" Plenum Press 1986, Chapter 15, Ion Implantation and Annealing, in "Semiconductor Devices Physics and Technology" S.M. Sze Ed., Wiley 1985, Chapter 10, Diffusion and Ion Implantation, and in Encyclopedia of Chemical Technology, Kirk-Othmer, Ion Implantation pp 706–719. The process involves implantation by means of a high-energy ion beam. Typically, an ion source, such as for example, phosphine, is ionized in an ion implantation apparatus by electron impact, emitted from a hot tungsten source. The ions produced in a high vacuum region are analyzed and mass separated by a magnetic field. The desired ions, such as for example phosphorus, are then accelerated by an electric field to high energies. The resulting ion beam is passed through scanners and allowed to strike the target substrate. Accurate control of ion implantation is possible because (a) the average penetration depth of implanted ions depends on their energies and (b) the total number of ions depends on the beam current. In view of the latter relationship it is important that the beam contains a high percentage of the desired ion species. Thus, for efficient ion implantation it is desirable to have a high total beam current and a high percentage of the desired ion in the beam current.

BRIEF SUMMARY OF INVENTION

This invention deals with a method for the ion implantation of phosphorus and arsenic ions into a semiconductor substrate using alkyl phosphines and alkylarsines as the source of phosphorus and arsenic ions. Surprisingly, the use of liquid alkylphosphines and alkylarsines, rather than gaseous phosphine and arsine, as the ion source results in a higher percentage of phosphorus ion ($P^+$) and arsenic ion ($As^+$) species in the beam current that is generated. In addition to the improved ion implantation efficiency obtained using alkylphosphines and alkylarsines, they are also preferred over phosphine and arsine due to their lower toxicity, less pyrophoricity and safer handling.

The alkylphosphines and alkylarsines of this invention are also preferred over solid phosphorus and solid arsenic as a source of phosphorus and arsenic ions, due to the difficulty in controlling the rate of sublimation/evaporation of the solid materials during the required preheating process.

DESCRIPTION OF PREFERRED EMBODIMENT

Organophosphorus compounds useful in this invention are certain alkylphosphine derivatives represented by the formula $R_1R_2R_3P$ in which $R_1$ is an alkyl hydrocarbon radical containing from two to five carbon atoms each of $R_2$ and $R_3$ is selected from the group consisting of hydrogen and alkyl hydrocarbon radicals from two to five carbon atoms. Representative types of such materials include primary phosphines, represented by the formula $R_1PH_2$, secondary phosphines represented by the formula $R_1R_2PH$, and tertiaryphosphines represented by the formula $R_1R_2R_3P$ in which $R_1$, $R_2$ and $R_3$ is an alkyl radical as defined above. Specific examples of the $R_1PH_2$ type include n-propylphosphine, isopropylphosphine, n-butylphosphine, isobutylphosphine, tertiarybutylphosphine, n-amylphosphine, isoamylphosphine, tertiaryamylphosphine and the like. Examples of the $R_1R_2PH$ type include diethylphosphine, di-n-propylphosphine, diisopropylphosphine, di-n-butylphosphine, diisobutylphosphine, ditertiarybutylphosphine, di-n-amylphosphine, diisoamylphosphine, ditertiaryamylphosphine and the like. Examples of the $R_1R_2R_3P$ type include triethylphosphine, tri-n-propylphosphine, triisopropylphosphine, tri-n-butylphosphine, triisobutylphosophine, tritertiarybutylphosphine, tri-n-amylphosphine, triisoamylphosphine, tritertiaryamylphosphine, diethyl-n-propylphosphine, diethyl-n-butylphosphine, diethylisobutylphosphine, diethyltertiarybutylphosphine, diethyltertiaryamylphosphine, di-n-propyltertiarybutylphosphine, diisobutyltertiarybutylphosphine, di-n-butylisobutylphosphine, di-n-butyltertiaryamylphosphine and the like.

Organoarsenic compounds useful in this invention are certain alkylarsine derivatives represented by the formula $R_1R_2R_3As$ in which $R_1$ is an alkyl hydrocarbon radical containing from two to five carbon atoms and $R_2$ and $R_3$ are selected from the group consisting of hydrogen and alkyl hydrocarbon radicals containing from two to five carbon atoms. Representative types of such materials include primary arsines, represented by the formula $R_1AsH_2$, secondary arsines represented by the formula $R_1R_2AsH$, and tertiaryarsines represented by the formula $R_1R_2R_3As$ in which $R_1$, $R_2$, and $R_3$ is an alkyl radical as defined above. Specific examples of the $R_1AsH_2$ type include n-propylarsine, isopropylarsine, n-butylarsine, isobutylarsine, secondarybutylarsine, tertiarybutylarsine, n-amylarsine, isoamylarsine, tertiaryamylarsine and like. Examples of the $R_1R_2AsH$ type include diethylarsine, d-n-propylarsine, diisopropylarsine, di-n-butylarsine, disecondarybutylarsine, ditertiarybutylarsine, di-n-amylarsine, diisoamylarsine, ditertiaryamylarsine and the like. Examples of $R_1R_2R_3As$ type include triethylarsine, tri-n-propylarsine, triisopropylarsine, tri-n-butylarsine, triisobutylarsine, tri-sec-butylarsine, tritertiarybutylarsine, tri-n-amylarsine, triisoamylarsine, tritertiaryamylarsine, diethyl-n-propylarsine, diethyl-n-butylarsine, diethylisobutylarsine, diethyltertiarybutylarsine, diethyltertiaryamylarsine, di-n-propyltertiarybutylarsine, diisobutyltertiarybutylarsine, di-n-butylisobutylarsine, di-n-butyltertiaryamylarsine and the like.

In the practice of the invention, the liquid alkylphosphine or alkylarsine is introduced into a commercially available ion implantation apparatus and allowed to ionize by electron impact. The flux of electron current is supplied by cathode source such as tungsten. The mixed ion beam thus produced passes through a mass-separating analyzer magnet and the desired $P^+$ or $As^+$ ion species is then accelerated to higher energies by an electric field. The high-energy ion beam is directed into the semiconductor substrate, such as for example silicon, at selected zones or regions.

The alkylphosphines and alkylarsines of this invention are useful as sources of phosphorus and arsenic ions for the ion implantation n-type doping of a variety of semiconductor materials. They are particularly useful in the fabrication of integrated circuits in adjusting threshold voltage in field-effect transistors (FET), resistivity in resistors, and in the formation of junctions in solar cells.

EXAMPLE 1

Tertiarybutylphosphine is introduced into an ion implantation apparatus operating at an energy level of 50 kV, and phosphorus ions produced at the tungsten cathode are passed through the mass analyzer and accellerated to make a high-energy ion beam which is directed to a target of semiconductor material to effect ion implantation. The total beam current and the phosphorus ion (P+) beam current generated from the tertiarybutylphosphine source is shown in Table I. Also shown, for comparison purposes, are the total beam current, and the phosphorus ion (P+) beam current for an ion beam generated using the prior art phosphine gas as the ion source.

The data clearly shows that a much higher proportion of phosphorus ion beam current in the total beam current, expressed as % P+ of total, is obtained by using tertiarybutylphosphine instead of phosphine as the ion source. Thus tertiary butylphosphine provides a much more efficient source of phosphorus ion P+ species which in turn provides improved ion implantation efficiency.

TABLE I

| p-SOURCE | TOTAL BEAM CURRENT (mA) | BEAM CURRENT (mA) P+ | % P+ OF TOTAL |
|---|---|---|---|
| Tertiarybutyl-phosphine | 41 | 16 | 39 |
| Tertiarybutyl-phosphine | 22 | 8 | 36 |

TABLE I-continued

| p-SOURCE | TOTAL BEAM CURRENT (mA) | BEAM CURRENT (mA) P+ | % P+ OF TOTAL |
|---|---|---|---|
| Phosphine | 51 | 10 | 20 |

EXAMPLE 2

Tertiarybutylarsine is substituted for tertiarybutylphosphine using the procedure of Example 1 and similar results are obtained showing the higher efficiency of arsenic ion (As+) beam current.

EXAMPLE 3

Isobutylphosphine is substituted for tertiarybutylphosphine using the procedure of Example 1 and similar results are obtained showing the higher efficiency of phosphorus ion (P+) beam current.

We claim:

1. In a method for ion implantation to modify properties of semiconductor material which method comprises steps of forming P+ or As+ ions by ionization of an organic phosphorus or arsenic compound and directing a high energy ion beam of said ions to the material to be modified, the improvement wherein the organic phosphorus or arsenic compound that is ionized to make the ion beam is a compound defined by the formula $R_1R_2R_3P$ or $R_1R_2R_3As$ wherein $R_1$ is alkyl having two to five carbon atoms and each of $R_2$ and $R_3$ is hydrogen or alkyl having two to five carbon atoms.

2. A method defined by claim 1 wherein $R_1$ is branched chain alkyl and $R_2$ and $R_3$ are H.

3. A method defined by claim 1 wherein the compound is $R_1R_2R_3P$.

4. A method defined by claim 1 wherein the compound is $R_1R_2R_3As$.

5. A method defined by claim 2 wherein the compound is tertiarybutylphosphine.

6. A method defined by claim 2 wherein the compound is isobutylphosphine.

7. A method defined by claim 2 wherein the compound is tertiarybutylarsine.

* * * * *